United States Patent
San et al.

(10) Patent No.: US 6,383,870 B2
(45) Date of Patent: May 7, 2002

(54) SEMICONDUCTOR DEVICE ARCHITECTURES INCLUDING UV TRANSMISSIVE NITRIDE LAYERS

(75) Inventors: Kemal Tamer San; Wei William Lee, both of Plano; Cetin Kaya, Dallas, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/895,594

(22) Filed: Jun. 28, 2001

Related U.S. Application Data

(62) Division of application No. 09/225,581, filed on Jan. 5, 1999, now Pat. No. 6,274,900.
(60) Provisional application No. 60/070,568, filed on Jan. 5, 1998.

(51) Int. Cl.[7] .............................................. H01L 21/336
(52) U.S. Cl. ........................ 438/257; 438/595; 438/258; 438/972
(58) Field of Search .................................. 438/257, 595, 438/258, 972, 593

(56) References Cited

U.S. PATENT DOCUMENTS

| | | | |
|---|---|---|---|
| 5,267,195 A | 11/1993 | Kodama | 365/185 |
| 5,273,923 A | 12/1993 | Chang et al. | 437/43 |
| 5,282,160 A | 1/1994 | Yamagata | 365/185 |
| 5,440,158 A | 8/1995 | Sung-Wu | 257/314 |
| 5,606,521 A | 2/1997 | Kuo et al. | 365/149 |
| 5,619,052 A | 4/1997 | Chang et al. | 257/321 |
| 5,731,142 A * | 3/1998 | Parat et al. | 438/586 |
| 5,929,479 A | 7/1999 | Oyama | 257/315 |
| 5,940,735 A * | 8/1999 | Mehta et al. | 438/783 |
| 5,981,993 A | 11/1999 | Cho | 257/311 |
| 6,038,171 A | 3/2000 | McElheny | 365/185.14 |
| 6,069,381 A | 5/2000 | Black et al. | 257/316 |
| 6,087,695 A | 7/2000 | Chen | 257/314 |
| 6,190,966 B1 * | 2/2001 | Ngo et al. | 438/257 |

FOREIGN PATENT DOCUMENTS

| | | | |
|---|---|---|---|
| JP | 405067791 | 5/1994 | 257/314 |
| JP | 406125089 | 5/1994 | 257/314 |

* cited by examiner

*Primary Examiner*—Trung Dang
(74) *Attorney, Agent, or Firm*—Jacqueline J. Garner; W. James Brady, III; Frederick J. Telecky, Jr.

(57) ABSTRACT

A transistor 10 is formed on an outer surface of a substrate 12. The transistor comprises a floating gate 18 and a control gate 20. An outer encapsulation layer 22 and sidewall bodies 26 and 28 comprise silicon nitride that is deposited in such a manner such that the material is transmissive to ultraviolet radiation. In this manner, the sidewall bodies 26 and 28 and the layer 22 can be used as an etch stop during the formation of a drain contact 38. These layers will also permit the transmission of ultraviolet radiation to the floating gate 18 to enable the erasure of floating gate 18.

6 Claims, 2 Drawing Sheets

US 6,383,870 B2

SEMICONDUCTOR DEVICE ARCHITECTURES INCLUDING UV TRANSMISSIVE NITRIDE LAYERS

This is a divisional application of U.S. patent application Ser. No. 09/225,581 filed Jan. 5, 1999, now U.S. Pat. No. 6,274,900, which is a non-provisional application of provisional application number 60/070,568 filed Jan. 5, 1998.

TECHNICAL FIELD OF THE INVENTION

This invention relates in general to the field of electronic devices and, more particularly, to improved architectures for semiconductor devices that include nitride layers that are transmissive to ultraviolet radiation.

BACKGROUND OF THE INVENTION

The formation of modern integrated circuit elements often includes chemical etch processes where various chemicals react with materials in an integrated architecture being constructed to remove portions of the materials. In these processes, certain materials are often used to protect portions of the device from chemicals being used to form other portions of the device. In these processes, developers utilize the selective nature of certain processes to erode one type of material and leave another type of material substantially unaffected. In this context, silicon nitride is often used as an etch stop for chemical etching processes used to etch silicon dioxide layers. By using silicon nitride layers as an etch stop, device architectures can be compactly spaced and overall device density can be increased.

A significant problem arises, however, when silicon nitride etch stop layers are used with flash memory or electrically erasable programmable read only memory (EEPROM) or UV EPROM devices. These devices typically utilize a floating gate that stores charge representative of data stored by the memory device. This charge is placed on the floating gate through operations that result in charge injection onto the floating gate. The charge is removed from the gate electrically or the memory cell is erased by exposing the device to ultraviolet radiation for a sufficient period of time. If the floating gate is covered by a silicon nitride layer, the floating gate will either not be able to be erased or the time period required to erase the floating gate will be dramatically increased, thereby reducing the effectiveness of the device.

SUMMARY OF THE INVENTION

Accordingly, a need has arisen for a semiconductor device architecture that allows for the use of silicon nitride as an etch stop within electronic devices but does not prevent the operation of memory systems that require ultraviolet radiation for erasability.

In accordance with the teachings of the present invention, a semiconductor device architecture is provided that substantially eliminates or reduces disadvantages associated with prior architectures and methods of construction.

In accordance with one embodiment of the present invention, a semiconductor device architecture is provided that comprises a floating gate formed outwardly from an outer surface of a semiconductor layer. A control gate is formed outwardly from the floating gate and separated therefrom by an interstitial insulator layer. The control gate and floating gate are covered by a silicon nitride encapsulation layer that comprises silicon nitride that exhibits a refractive index of less than 2.0 such that the transmittance of the silicon nitride material with respect to ultraviolet radiation is sufficient to allow for the erasure of charge stored on the floating gate by the radiation of the floating gate with ultraviolet radiation.

An important technical advantage of the present invention inheres in the fact that a silicon nitride etch stop layer can be used to completely encapsulate a gate structure for a flash memory or EEPROM device. The silicon nitride etch stop layer can be used to form the drain or bit line contact to the device and allows this contact to be spaced very close to the region occupied by the gate. Alternatively, the silicon nitride layer can be used to prevent the etching of the field oxide material surrounding the active moat area of an integrated device. This prevents the drain or bit line contact of a memory device from directly contacting the semiconductor substrate material within the active region of the device.

BRIEF DESCRIPTION OF THE DRAWINGS

A more complete understanding of the teachings of the present invention and the advantages thereof may be acquired by referring to the accompanying figures in which like reference numbers indicate like features and wherein.

DETAILED DESCRIPTION OF THE INVENTION

Figure 1:
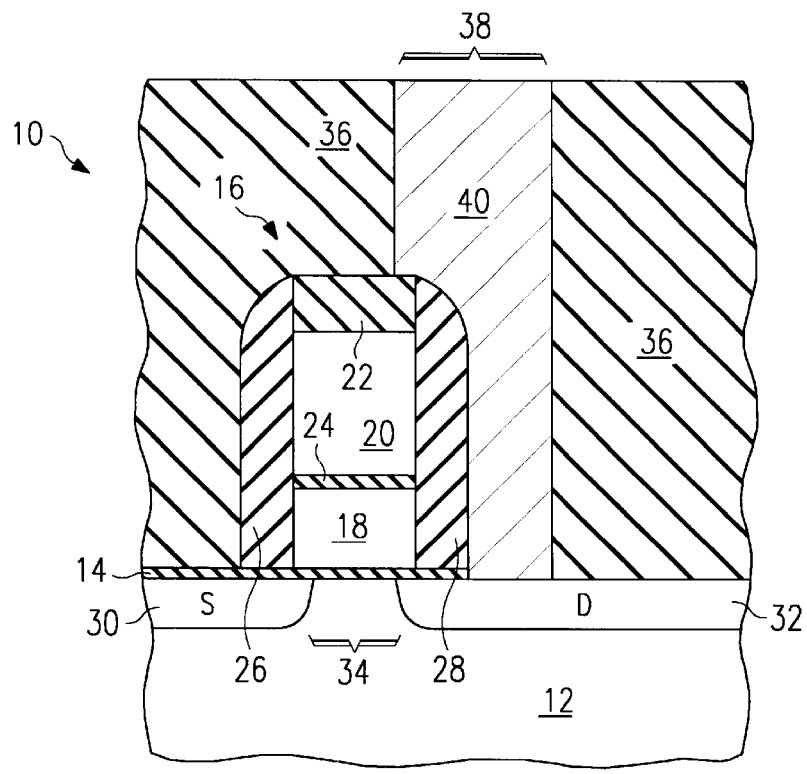
FIG. 1 is a greatly enlarged cross-sectional elevational diagram of a transistor constructed according to the teachings of the present invention.

FIG. 1 illustrates a transistor, indicated generally at 10, that is formed on the outer surface of a semiconductor substrate 12. Semiconductor substrate 12 may comprise, for example, a wafer of single crystalline silicon or other suitable semiconductor material. A gate oxide layer 14 is formed on an outer surface of substrate 12. Gate oxide layer 14 may comprise, for example, a layer of silicon dioxide that is grown to be on the order of 90 Angstroms in thickness. Alternatively, gate oxide layer 14 may comprise silicon nitride or combinations of layers of silicon dioxide and silicon nitride.

Transistor 10 is controlled through the operation of a gate stack indicated generally at 16 that comprises a floating gate 18, a control gate 20, and an outer encapsulation layer 22. Control gate 20 and floating gate 18 are separated by an interstitial insulator layer 24. Floating gate 18 is formed from a layer of polysilicon which is on the order of 1500 Angstroms in thickness. Interstitial insulator layer 24 may comprise a first layer of silicon dioxide, a layer of silicon nitride, and a second layer of silicon dioxide with all three layers being on the order of 60 Angstroms in thickness. Alternatively, interstitial insulator layer 24 may comprise a homogenous layer of silicon dioxide or silicon nitride or other combinations of these layers. The control gate 20 may comprise a layer of polycrystalline silicon on the order of 2500 Angstroms in thickness and may also comprise tungsten silicide layers or other like materials. The floating gate 18 and the control gate 20 are both doped either in situ as they are formed or after they are formed with sufficient amounts of impurities to render them conductive.

Outer encapsulation layer 22 comprises a layer of silicon nitride on the order of 1000 Angstroms in thickness. In order to form gate stack 16, the layers from which floating gate 18, interstitial insulator layer 24, control gate 20 and outer encapsulation layer 22 are formed are all deposited or grown outwardly from gate insulator layer 14. The entire structure can then be patterned, masked and etched using conventional photolithographic techniques.

Following the formation of gate stack 16, a layer of silicon nitride is conformably deposited covering gate stack 16 and the outer surface of gate insulator layer 14. This layer is on the order of 1,000 Angstroms in thickness. This layer is anisotropically etched until the outer surface of gate oxide layer 14 is exposed leaving sidewall bodies 26 and 28 disposed on opposite sidewalls of the gate stack 16. Sidewall bodies 26 and 28 will be something less than 1000 Angstroms in width after the anisotropic etch process is completed and typically will be on the order of 800 or 900 Angstroms in width if the initial thickness is chosen to be 1000 Angstroms.

Following the formation of sidewall bodies 26 and 28, ion plantation processes are used to form a source region 30 and a drain region 32. In a typical flash memory or EEPROM memory architecture, the drain region 32 will be connected to the bit line of the array and the control gate 20 will be connected to the word line of the array. The source region 30 will be electrically connected and shared with adjacent memory cells. The source region 30 and the drain region 32 define a channel region, indicated generally at 34, in the outer surface of substrate 12. The conductance of the channel region 34 is controlled by placing a voltage on the control gate 20. The conductance is further controlled by whether or not a sufficient amount of charge is trapped within the floating gate 18.

As shown in FIG. 1, the control gate 20 and the floating gate 18 are completely encapsulated by silicon nitride sidewall bodies 26 and 28 and outer encapsulation layer 22. Together, these structures form a silicon nitride encapsulation shell that will prevent later etch processes from inadvertently attacking the polysilicon used to form the control gate 20 and the floating gate 18.

An interlevel isolation layer 36 is then deposited covering the entire gate stack 16 and the sidewall bodies 26 and 28. Interlevel isolation layer 36 may comprise on the order of 9000 Angstroms of silicon dioxide. Interlevel isolation layer 36 is then patterned and etched to form a contact opening indicated generally at 38. A drain contact 40 is then formed in opening 38 to provide electrical contact to the drain region 32. According to an alternate embodiment of the present invention, additional processes are utilized to form a titanium silicide layer on the outer surface of drain region 32 to reduce the contact resistance between drain contact 40 and drain region 32. Drain contact 40 may comprise, for example, tungsten, aluminum, platinum, or copper.

Due to the fact that the control gate 20 and floating gate 18 are encapsulated by bodies 26 and 28 and layer 22, the etch process used to form opening 38 can be designed to be selective to silicon nitride relative to silicon dioxide. In other words, the etch chemistry used to form opening 38 will remove the silicon dioxide comprising interlevel isolation layer 36 without substantially removing the silicon nitride forming sidewall body 28 or outer encapsulation layer 22. Because of this fact, the opening 38 can be advantageously placed extremely close to and even overlapping with the control gate 20 and floating gate 18. The ability to closely place the drain contact 40 relative to the gate stack 16 provides for the overall reduction in the dimension of the memory cell formed by transistor 10. A reduction in the cell size of each memory cell means a correspondingly larger reduction in the size of the entire memory array.

Accordingly, an architecture is provided that allows for an extremely compact memory cell architecture. However, transistor 10 utilizes the floating gate 18 that is erased by exposing the floating gate 18 to ultraviolet radiation. Accordingly, the silicon nitride encapsulation shell formed by sidewall bodies 26 and 28 and layer 22 must have a sufficient ultraviolet transmittance to allow for the erasure of the floating gate 18. This can be accomplished by altering the conventional way that silicon nitride is deposited. Normal silicon nitride will have a refractive index between 2.0 and 2.1. By altering the deposition of the silicon nitride according to the teachings of the present invention, the refractive index can be reduced to less than 2.0 and can be reduced as low as 1.86. In this manner, ultraviolet transmittance of up to 90% can be achieved through the silicon nitride formed using the techniques of the present invention.

Silicon nitride can be deposited using a plasma-enhanced chemical vapor deposition process that uses silane, ammonia, and nitrogen as source gases. According to the teachings of the present invention, the nitrogen is provided on approximately 1,800 cc/second. The silane is provided on the order of 85 cc/second. This compares to a silane introduction rate on the order of 180 cc/second for conventional silicon nitride deposition. The RF power for the plasma enhancement is set to on the order of 345 watts. This compares to a conventional setting of 415 watts. The pressure of the reactive vessel is held at 5 torr. This compares to a conventional pressure on the order of 4.5 torr. The ammonia is introduced on the order 40 cc/second compared to a conventional rate of 75 cc/second. Using these parameters, refractive indices as low as 1.86 are possible corresponding to an ultraviolet transmittance as high as 90%. Conventional nitride has a refractive index greater than 2.0 and a corresponding UV transmittance on the order of 30–40%.

Figure 2A:
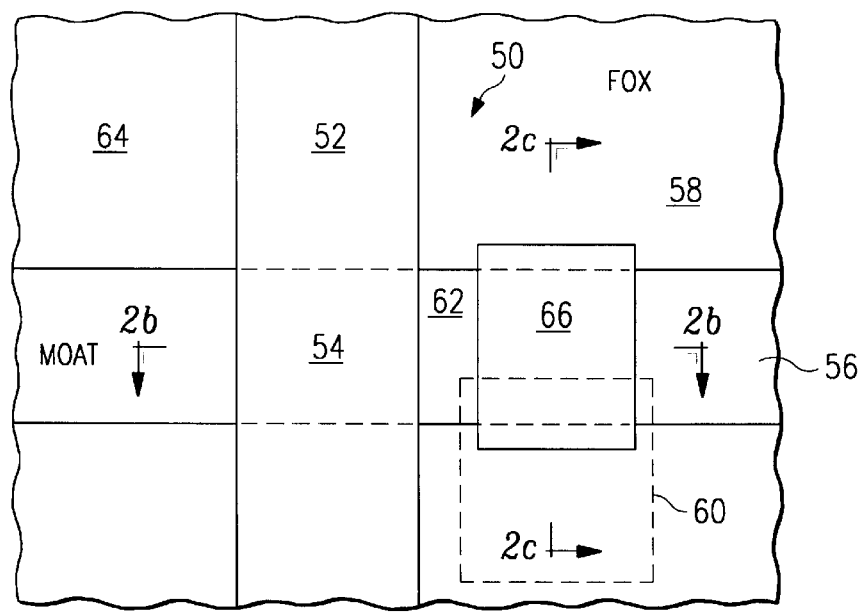
FIGS. 2A through 2C are selected cross-sectional and planer views of an alternate embodiment of a transistor constructed according to the teachings of the present invention.
Figure 2B:
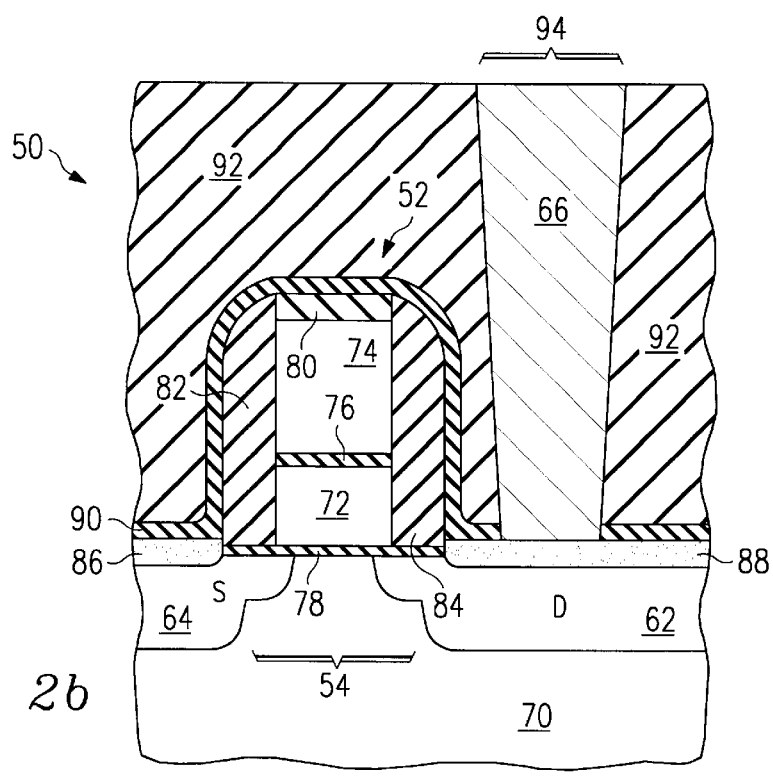
Figure 2C:
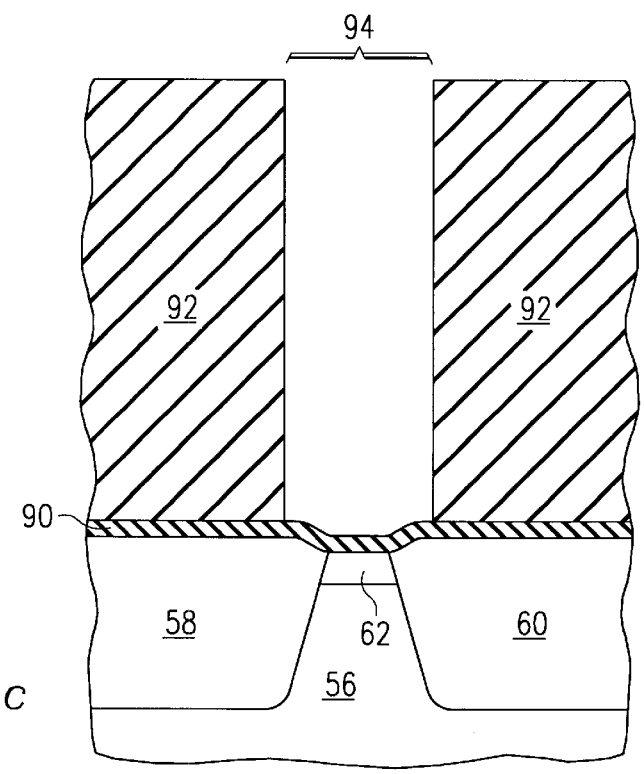

FIGS. 2A through 2C illustrate an alternate application of the teachings of the present invention. FIGS. 2A through 2C illustrate a transistor architecture where the drain contact is not as closely spaced to the gate stack but must be spaced carefully with respect to the moat region and the surrounding field oxide material. Referring to FIG. 2A, a transistor, indicated generally at 50, comprises a control gate stack 52. As discussed previously, the control gate stack comprises both a control gate and a floating gate separated by an interstitial insulator layer. The control gate stack is separated from the surface of the semiconductor substrate by a gate insulator layer. These structures will be more completely depicted with reference to FIG. 2B herein.

A channel region 54 is defined by the intersection of the control gate stack 52 with an active moat region 56. On opposite sides of the active moat region 56 are field oxide regions 58 and 60. The portion of moat region 56 on the right side of control gate stack 52 is a drain region 62. The left side of control gate stack 52 is a shared source region 64 which runs parallel to the control gate stack 52. Outwardly from drain region 62 and spaced apart from control gate stack 52 is a drain contact 66 which is generally square in shape and is intended to be centered over moat region 56. It should be understood, however, that drain contact 66 must be formed using conventional photolithographic processes. As such, drain contact 66 may not actually be centered on moat region 56 and must be sized because of misalignment tolerances to be somewhat larger than moat region 56 to ensure contact with drain region 62. As will be discussed herein, a silicon nitride layer is used to prevent the unwanted etching of field oxide regions 58 and 60 during the formation of the opening in the isolation insulator layer used to form the drain contact 66.

FIG. 2 illustrates the cross-section of transistor 50 shown along the 2B cross-section illustrated in FIG. 2A. Transistor 50 is constructed on a semiconductor substrate 70 which may comprise, for example, a single crystalline layer of silicon or other suitable semiconductor material. As discussed previously, the control gate stack indicated generally at 52 comprises a floating gate 72 and a control gate 74 separated by an interstitial insulator layer 76. The floating gate 72 is separated from the outer surfaces of substrate 70 by gate insulator layer 78. Gate insulator layer 78 may be constructed identically to gate insulator layer 14 discussed previously. Similarly, floating gate 72, interstitial insulation layer 76, and control gate 74 may be constructed identically as floating gate 18, insulator layer 24, and control gate 20 discussed with reference to FIG. 1 previously.

A titanium silicide layer 80 on the order of 500 Angstroms in thickness may be formed on the outer surface of control gate 74 to reduce the resistance of control gate 74. Following the formation of control gate stack 52, sidewall bodies 82 and 84 may be formed by conformally depositing an insulation layer and anisotropically etching the insulation layer until bodies 82 and 84 remain. Bodies 82 and 84 may comprise silicon dioxide, silicon nitride, or alternating layers of silicon dioxide and silicon nitride. Bodies 82 and 84 may be formed using the techniques described with reference to bodies 26 and 28 described with reference to FIG. 1 previously. Following the formation of bodies 82 and 84, implant processes can be used to form the source region 64 and the drain region 62 discussed previously with reference to FIG. 2A. According to one embodiment of the present invention, successive implantation processes using different implant energies can be used to provide for the shallow junction source and drain region profiles shown in FIG. 2B. After the formation of source and drain regions 64 and 62, a titanium silicide layer 86 can be formed outwardly from source region 64 and a titanium silicide layer 88 can be formed outwardly from drain region 62 in order to reduce the sheet resistance of these regions and to provide lower contact resistance with source and drain contacts formed in successive operations. Layers 86 and 88 may be on the order of 500 Angstroms in thickness.

A silicon nitride encapsulation layer 90 can then be deposited covering the entire structure. Silicon nitride encapsulation layer 90 may be on the order of 300 Angstroms in thickness. Silicon nitride encapsulation layer 90 may be formed using the silicon nitride deposition process detailed earlier such that although layer 90 completely encapsulates floating gate 72, the ultraviolet transmittance of layer 90 will allow ultraviolet radiation to penetrate and thereby allow the erasure of floating gate 72 as required.

An interlevel insulator layer 92 is then deposited outwardly from layer 90. Interlevel insulator layer 92 may comprise on the order of 9,000 Angstroms of silicon dioxide. Using photolithographic processes, an opening 94 is then made in layer 92 by first using an etch process which is selective to silicon nitride relative to silicon dioxide. In other words, the etch process used to make opening 94 will remove the silicon dioxide within layer 92 but will stop when it reaches silicon nitride encapsulation layer 90. A second etch process selective to silicon dioxide and silicon relative to silicon nitride is then used to remove the exposed portions of layer 90 to provide direct contact to the titanium silicide layer 88 disposed outwardly from drain region 62. Drain contact 66 is then formed in opening 94. Drain contact 66 may be formed using the same process as used to form drain contact 38 discussed with reference to FIG. 1 previously.

The etch processes used to form opening 94 are problematic because of the necessity of making opening 94 larger than moat region 56 due to the possibility of misalignment error. This creates a potential of etching through the field oxide region 58 and 60 and providing inadvertent contact between the drain contact 66 and the semiconductor substrate within moat region 56.

The solution to this problem is clearly illustrated in FIG. 2C, which is a cross-sectional illustration taken along section line 2C shown in FIG. 2A. FIG. 2C illustrates the placement of moat region 56 relative to opening 94. FIG. 2C clearly illustrates that the opening 94 in isolation layer 92 extends beyond the edges of moat region 56 and overlaps with field oxide regions 60 and 58. Field oxide regions 58 and 60 may comprise, for example, silicon dioxide layers on the order of 3,500 Angstroms in thickness that are formed using conventional shallow trench isolation techniques. As shown in FIG. 2C, silicon nitride encapsulation layer 90 extends outwardly and underneath opening 94. If layer 90 were not present, the initial etch processes that were used to form opening 94 could also remove enough of field oxide region 60 or field oxide region 58 to expose portions of the sidewalls of moat region 56. In this manner, after the formation of drain contact 66, electrical contact could be made between drain contact 66 and the undoped substrate within moat region 56 disposed inwardly from drain region 62 shown in FIG. 2C. This inadvertent contact could dramatically affect the operation of transistor 50.

In comparison, because of the inclusion of layer 90, an initial etch process is used to remove the silicon dioxide of layer 92. This etch process stops on layer 90. A second etch process is then used to remove the portion of layer 90 within opening 94. The second etch process only etches silicon nitride substantially and will not substantially remove the silicon dioxide within field oxide regions 58 or 60. In this manner, the drain contact 66 only contacts drain region 62 and is isolated from the remainder of moat region 56 by the field oxide regions 58 and 60.

The encapsulation layer 90 can be used in this context because it is transmissive to ultraviolet light. Accordingly, it can be used as an etch stop without affecting the operation and the erasure of floating gate 72 described previously.

Although the present invention has been described in detail, it should be understood the various alterations, substitutions, and modifications that may be made to the teachings contained herein without departing from the spirit and scope of the present invention which is solely defined by the appending claims.

What is claimed is:

1. A method of forming a semiconductor device proximate a surface of a semiconductor layer, comprising:

forming a gate stack outwardly from the surface of the semiconductor layer, the gate stack operable to control the conductance of a channel region of the semiconductor layer proximate the gate stack;

forming a silicon nitride encapsulation layer covering portions of the gate stack, the silicon nitride encapsulation layer comprising silicon nitride that exhibits a refractive index of less than 2.0 such that the transmittance of the silicon nitride material with respect to ultraviolet radiation is sufficient to allow for the erasure of charge stored on portions of the gate stack by the radiation of the gate stack with ultraviolet radiation.

2. The method of claim 1 and further comprising the steps of:

forming a drain region proximate an edge of the gate stack;

forming field oxide regions proximate the surface of the semiconductor substrate and the drain region;

forming an isolation insulator layer disposed outwardly from the drain region and the silicon nitride encapsulation layer;

forming a drain contact opening in the isolation insulator layer to expose a portion of the drain region;

forming a drain contact in the drain contact opening outwardly from the drain region, the silicon nitride encapsulation layer disposed outwardly from the drain region and the field oxide regions, the silicon nitride encapsulation layer operating as an etch stop during an etch process used to form an opening through the isolation insulator layer, the drain contact formed in the opening in the isolation insulator layer.

3. The method of claim 2 wherein the step of forming a drain contact comprises the step of forming a drain contact comprising a conductor chosen from the group consisting of tungsten, platinum, aluminum, and copper.

4. The method of claim 1 wherein the step of forming a gate stack comprises the steps of:

forming a floating gate outwardly from the surface of the semiconductor layer;

forming a control gate outwardly from the floating gate; and forming an interstitial insulator layer separating the control gate and the floating gate.

5. The method of claim 4 wherein the control gate and the floating gate comprise polysilicon and wherein the interstitial insulator layer comprises silicon dioxide.

6. The method of claim 1 wherein the step of forming a silicon nitride encapsulation layer comprises the steps of:

evacuating a reactor vessel containing the semiconductor device to a pressure of about 5 torr and providing a plasma enhancement at a power of about 345 Watts;

introducing nitrogen into the reactor vessel at a rate of about 1800 cc/second;

introducing silane into the reactor vessel at a rate of about 85 cc/second; and introducing ammonia into the reactor vessel at a rate of about 40 cc/second.

* * * * *